(12) United States Patent
Lee et al.

(10) Patent No.: US 8,846,484 B2
(45) Date of Patent: Sep. 30, 2014

(54) RERAM STACKS PREPARATION BY USING SINGLE ALD OR PVD CHAMBER

(75) Inventors: Albert Sanghyup Lee, Cupertino, CA (US); Chien-Lan Hsueh, Campbell, CA (US); Tim Minvielle, San Jose, CA (US); Takeshi Yamaguchi, Kanagawa (JP)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 13/397,414

(22) Filed: Feb. 15, 2012

(65) Prior Publication Data

US 2013/0210193 A1  Aug. 15, 2013

(51) Int. Cl.
*H01L 45/00* (2006.01)
*H01L 21/20* (2006.01)

(52) U.S. Cl.
USPC ............ 438/382; 257/E45.003; 257/E21.004; 365/148; 427/248.1

(58) Field of Classification Search
USPC ............ 438/102–104; 257/1–5, 43, E29.002, 257/E45.002; 365/163
See application file for complete search history.

(56) References Cited

U.S. PATENT DOCUMENTS

| | | | |
|---|---|---|---|
| 5,227,013 A | 7/1993 | Kumar | |
| 7,501,320 B2 | 3/2009 | Park | |
| 7,741,636 B2 | 6/2010 | Ho | |
| 7,763,953 B2 | 7/2010 | Tanioku | |
| 8,295,075 B2 * | 10/2012 | Chien et al. | 365/148 |
| 8,334,015 B2 | 12/2012 | Chiang | |
| 2002/0001906 A1 * | 1/2002 | Park | 438/287 |
| 2002/0030577 A1 * | 3/2002 | Shibuya et al. | 338/308 |
| 2003/0143328 A1 * | 7/2003 | Chen et al. | 427/255.28 |
| 2004/0214425 A1 * | 10/2004 | Lin et al. | 438/629 |
| 2004/0228172 A1 * | 11/2004 | Rinerson et al. | 365/158 |
| 2006/0228868 A1 * | 10/2006 | Ahn et al. | 438/453 |
| 2006/0234500 A1 * | 10/2006 | Park | 438/648 |
| 2007/0116888 A1 * | 5/2007 | Faguet | 427/569 |
| 2007/0117407 A1 * | 5/2007 | Kwo et al. | 438/778 |

(Continued)

FOREIGN PATENT DOCUMENTS

| | | | |
|---|---|---|---|
| WO | WO-2009-032958 A1 | 3/2009 | |
| WO | WO-2011-115924 A1 | 9/2011 | |
| WO | WO-2011-115926 A1 | 9/2011 | |

OTHER PUBLICATIONS

Kim, K., et al.; Atomic Layer Deposition of Insulating Nitride Interfacial Layers for Germanium Metal Oxide Semiconductor Field Effect Transistors with Highk OxideTungsten Nitride Gate Stacks; May 21, 2007; Harvard, College (US) ; Applied Physics Letters pp. 9092.

*Primary Examiner* — Colleen Matthews
*Assistant Examiner* — Regan J Rundio

(57) ABSTRACT

Systems and methods for preparing resistive switching memory devices such as resistive random access memory (ReRAM) devices wherein both oxide and nitride layers are deposited in a single chamber are provided. Various oxide and nitride based layers in the ReRAM device such as the switching layer, current-limiting layer, and the top electrode (and optionally the bottom electrode) are deposited in the single chamber. By fabricating the ReRAM device in a single chamber, throughput is increased and cost is decreased. Moreover, processing in a single chamber reduces device exposure to air and to particulates, thereby minimizing device defects.

18 Claims, 7 Drawing Sheets

(56) References Cited

U.S. PATENT DOCUMENTS

| | | | |
|---|---|---|---|
| 2008/0274567 A1* | 11/2008 | Dahmani et al. | 438/3 |
| 2009/0061083 A1 | 3/2009 | Chiang et al. | |
| 2009/0272959 A1* | 11/2009 | Phatak et al. | 257/2 |
| 2009/0272962 A1* | 11/2009 | Kumar et al. | 257/4 |
| 2009/0309187 A1* | 12/2009 | Choi et al. | 257/532 |
| 2010/0110758 A1* | 5/2010 | Li et al. | 365/148 |
| 2010/0136313 A1 | 6/2010 | Shimizu | |
| 2010/0167463 A1* | 7/2010 | Sung | 438/104 |
| 2010/0226165 A1 | 9/2010 | Kang | |
| 2011/0108929 A1* | 5/2011 | Meng et al. | 257/411 |
| 2011/0186798 A1* | 8/2011 | Kwon et al. | 257/2 |
| 2011/0193181 A1* | 8/2011 | Jung et al. | 257/411 |
| 2011/0227020 A1 | 9/2011 | Sekar | |
| 2011/0227026 A1 | 9/2011 | Sekar | |
| 2011/0227028 A1* | 9/2011 | Sekar et al. | 257/4 |
| 2012/0032332 A1* | 2/2012 | Lim et al. | 257/751 |
| 2012/0120711 A1* | 5/2012 | Rabkin et al. | 365/148 |
| 2012/0241712 A1* | 9/2012 | Cai et al. | 257/4 |
| 2012/0280369 A1* | 11/2012 | Saito et al. | 257/629 |

* cited by examiner

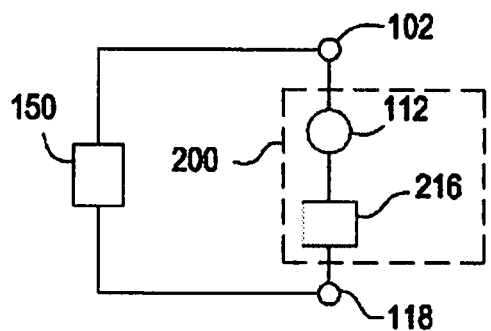
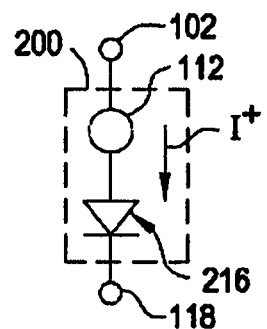
FIG. 2A  FIG. 2B
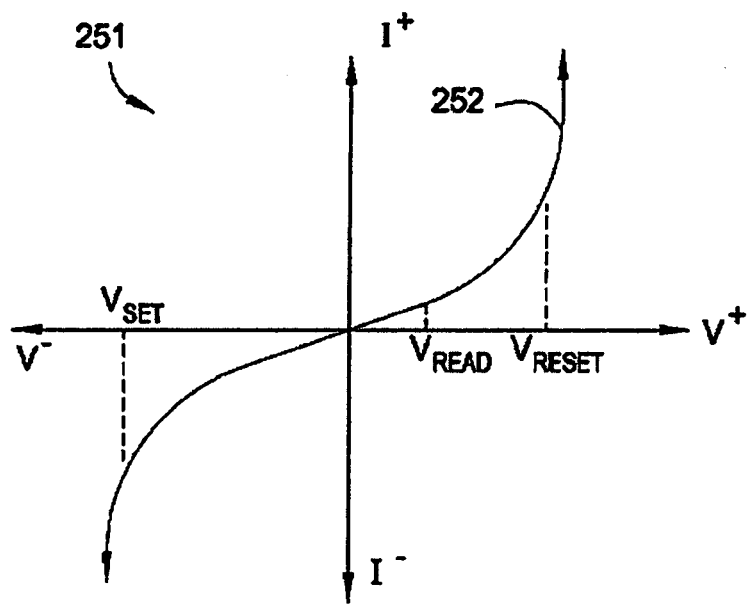
FIG. 2E

RERAM STACKS PREPARATION BY USING SINGLE ALD OR PVD CHAMBER

TECHNICAL FIELD

The present disclosure relates generally to fabrication of nonvolatile memory elements and in particular to systems and methods for preparing resistive switching memory devices in a single tool.

BACKGROUND

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments.

Nonvolatile memory is often formed using electrically-erasable programmable read only memory (EEPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues pose challenges for traditional nonvolatile memory technology. This has led to investigation of alternative nonvolatile memory technologies, including resistive switching nonvolatile memory, sometimes referred to as resistive random access memory (ReRAM).

Resistive switching nonvolatile memory is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

The resistive switching memory elements generally have a metal-insulator-metal (MIM) structure. In particular, these resistive switching memory elements typically include a metal oxide resistive switching layer between two conductive electrodes. The metal oxide resistive switching layer typically includes a metal oxide layer. Exemplary metal oxide layer materials include HfOx, ZrOx, AlOx, TiOx, TaOx, and the like. Alternatively, the metal oxide resistive switching layer may be a film stack including a metal oxide film, which serves as the host switching material with another metal oxide as the coupling layer. For example, the host switching material may be HfOx, and the coupling layer may be ZrOx, AlOx or TiOx.

A top electrode is typically formed above the metal oxide resistive switching layer(s). The top electrode is usually comprised of a metal nitride layer such as titanium nitride (TiN). Additionally, a current limiting layer may be provided. The current limiting layer may be comprised of a metal nitride, such as hafnium nitride (HfN).

Thus, to fabricate a ReRAM device, both oxide and nitride layers must be formed. In prior art systems, oxides and nitrides are formed in separate, distinct tools. Typically, all of the oxide layers are formed in one tool, such as a cluster tool. Wafers are transferred to a separate, distinct tool for formation of all of the nitride layers. Such processing is slow, and results in low throughput and low yield. Moreover, multiple tools are required and thus the capital and operating costs are high. Further, since the wafers must be transferred between tools, the vacuum environment is broken, and the wafers are exposed to particulate contamination. Accordingly, new developments and processes are needed.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Systems and methods for preparing resistive switching memory devices such as resistive random access memory (ReRAM) devices wherein both oxide and nitride layers are deposited in a single tool are provided. In some embodiments, a single tool is comprised of one or more atomic layer deposition (ALD) or chemical vapor deposition (CVD) chambers and one or more physical vapor deposition (PVD) chambers coupled together by a transfer chamber. Various oxide and nitride based layers in the ReRAM device such as the switching layer, current-limiting layer, and the top electrode (and optionally the bottom electrode) are deposited in the single tool. By fabricating the ReRAM device in a single tool having multiple chambers, throughput is increased and cost is decreased. Moreover, processing in a single tool reduces device exposure to air and to particulates, thereby minimizing device defects.

A method of forming a ReRAM device on a substrate is provided, In some embodiments, the ReRAM device is fabricated in a single tool comprising one or more ALD or CVD chambers and one or more PVD chambers coupled together by a transfer chamber. Oxide layers are formed on the substrate in the one or more ALD chambers. Nitride layers are formed on the substrate in any one of: the one or more PVD chambers or the one or more ALD chambers.

In some embodiments, a method for making a resistive switching memory device, such as a ReRAM device, is provided that includes forming a first electrode, and depositing in a single tool both metal oxide layers and metal nitride layers to form the resistive switching memory device.

In some embodiments, a method for making a resistive switching memory device is provided that includes forming a first electrode; and in a single tool: depositing a resistive switching layer above the first electrode by an atomic layer deposition process, and forming a second electrode comprised of one or more metal nitride layers above the resistive switching layer by any one of: atomic layer deposition, plasma enhanced atomic layer deposition, or physical vapor deposition. Optionally, a current limiting layer is deposited between the resistive switching layer and the second electrode. In some embodiments, the current limiting layer is comprised of one or more metal nitride layers and is deposited by any one of: atomic layer deposition, plasma enhanced atomic layer deposition, or physical vapor deposition.

In some embodiments, a method for making a resistive switching memory device is provided that includes forming a first electrode, and in a single chamber: depositing a resistive switching layer above the first electrode by atomic layer deposition, and forming a second electrode comprised of one or more metal nitride layers above the resistive switching layer by atomic layer deposition.

In some embodiments, a method for making a resistive switching memory device, such as a ReRAM device is provided where all of the layers that comprise the device are formed in a single chamber. In some embodiments, all layers of the device are formed in an ALD or CVD chamber. In other embodiments all layers of the device are formed in a PVD chamber. Thus, in some embodiments both oxide based layers and nitride based layers that form the device are made in a single chamber.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

FIG. 2A is schematic representation of a memory device in accordance with some embodiments of the present disclosure.

FIG. 2B is schematic representation of a memory device having a diode type current steering element in accordance with some embodiments of the present disclosure.

FIG. 2E is a graph illustrating the current (I) versus voltage (V) characteristics of a bipolar switching type memory element in accordance with some embodiments of the present disclosure.

DETAILED DESCRIPTION

Systems and methods for preparing resistive switching memory devices, such as resistive random access memory (ReRAM) devices, wherein both oxide and nitride layers are deposited in a single tool are provided. Is some embodiments, systems and methods for preparing resistive switching memory devices, such as resistive random access memory (ReRAM) devices, wherein both oxide and nitride layers are deposited in a single chamber are provided.

In some embodiments, the single tool comprises one or more atomic layer deposition (ALD) chambers, one or more chemical vapor deposition (CVD) chambers, and one or more physical vapor deposition (PVD) chambers coupled together by a transfer chamber. Various oxide and nitride based layers that form the ReRAM device such as a top electrode, switching layer and current-limiting layer are deposited in the single tool having multiple chambers.

In some embodiments, the oxide and nitride layers that form the ReRAM device as all deposited in a single ALD or CVD chamber. In some embodiments, the oxide and nitride layers that form the ReRAM device are all deposited in a single PVD chamber.

Figure 1:
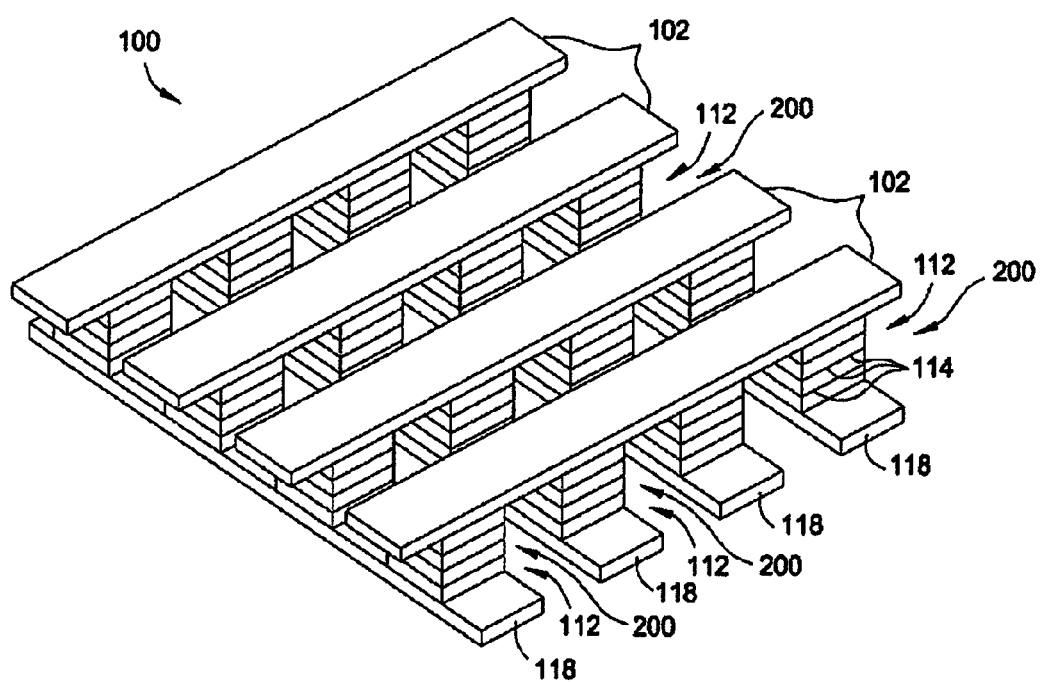
FIG. 1 illustrates an array of resistive switching memory elements in accordance with some embodiments of the present disclosure.

An illustrative memory array 100 of nonvolatile resistive switching memory devices 200 (hereafter switching memory device 200), which each generally include at least one resistive switching memory element 112, is illustrated in FIG. 1. Memory array 100 may be part of a larger memory device or other integrated circuit structure, such as a system on a chip type device. Read and write circuitry is connected to switching memory devices 200 using word-lines and orthogonal bit-lines, which are referred to herein generally as electrodes 102 and 118, and are used to read from or write data into the memory element 200. Electrodes 102 and 118, generally include one or more conductive layers that each have a desired function in the array of switching memory devices 200. In some configurations, the electrodes 102 and 118 each comprise two or more conductive layers in which a first conductive layer is used to interconnect the multiple switching memory devices 200 and a second conductive layer is disposed in each switching memory device 200 to provide a desirable electrical interface (e.g., desirable work function) to the adjacent components in the switching memory device 200. Individual switching memory devices 200 or groups of switching memory devices 200 can be accessed using appropriate sets of word-lines and bit lines, or electrodes 102 and 118.

The memory elements 112 in the switching memory devices 200 may be formed from one or more layers 114 of materials, as indicated schematically in FIG. 1. In addition, memory arrays such as memory array 100 can be stacked in a vertical fashion to make multilayer memory array structures. The use of resistive switching memory elements to form memory arrays is merely illustrative, and one skilled in the art will appreciate that the formed devices may be used in other device applications without deviating from the basic scope of the invention described herein.

FIG. 2A schematically illustrates one example of a switching memory device 200 that contains a memory element 112 and an optional current steering device 216, which are both disposed between the electrodes 102 and 118. In one configuration, the current steering device 216 is an intervening electrical component, such as a p-n junction diode, p-i-n diode, transistor, or other similar device that is disposed between electrode 102 and memory element 112, or between the electrode 118 and memory element 112. In one example, the current steering device 216 may include two or more layers of semiconductor material, such as two or more doped silicon layers, that are configured to allow or inhibit the current flow in different directions through the memory element 112 when that memory element is not selected to read.

FIG. 2B schematically illustrates a switching memory device 200 that contains a memory element 112 and a diode type current steering device 216 that preferentially allows current to flow through the memory device 200 in a forward direction ("I+"). However, due to the design of the current steering device 216, a reduced current can also flow in the opposing direction through the device by the application of a reverse bias to the electrodes 102 and 118.

Figure 2C:
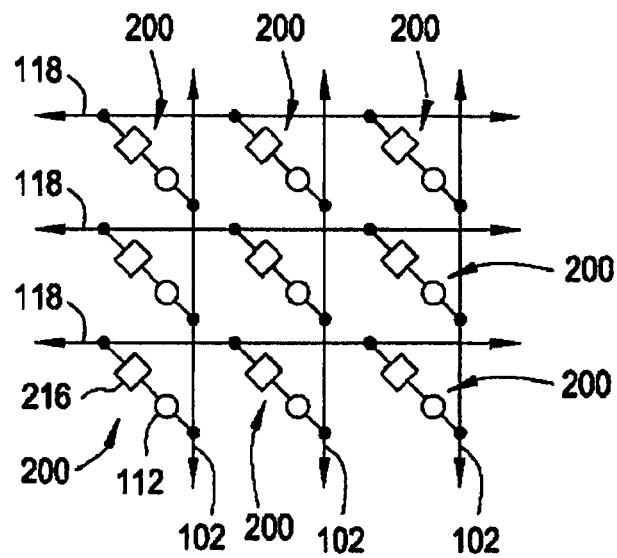
FIG. 2C is schematic representation of an array of memory devices in accordance with some embodiments of the present disclosure.

FIG. 2C schematically illustrates an array of switching memory devices 200 that are connected together to form part of a high-capacity nonvolatile memory integrated circuit. Each of the individual switching memory devices 200 can be accessed using appropriate sets of discrete word-lines and bit-lines, which, as noted above, may comprise at least a portion of the electrodes 102 and 118. As illustrated in FIG. 2C, each of the switching memory devices 200 contains a memory element 112 and current steering device 216 (e.g., a diode type) that are connected to at least one of the electrodes 102 and at least one of the electrodes 118. The electrodes 102 and/or 118 are generally biased by circuitry that is connected at the periphery of the memory chip on which the array of memory devices 200 are formed.

Figure 2D:
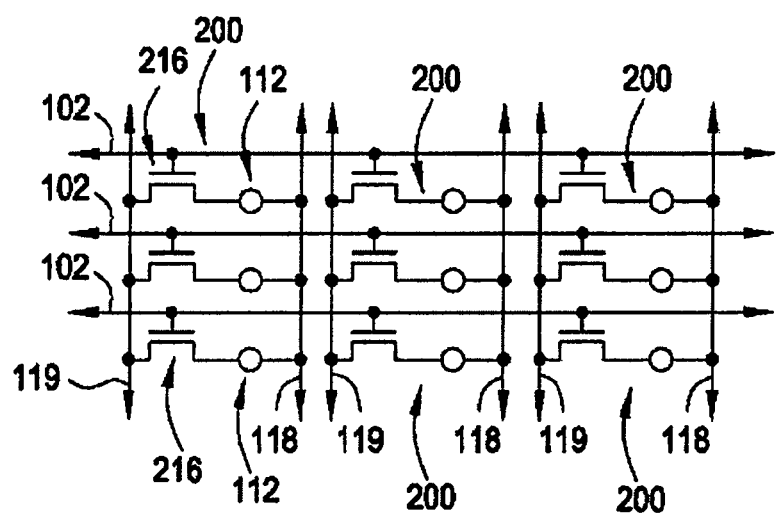
FIG. 2D is schematic representation of an array of memory devices in accordance with some embodiments of the present disclosure.

FIG. 2D schematically illustrates another embodiment of an array of switching memory devices 200 that are connected together to form part of a high-capacity nonvolatile memory integrated circuit. As shown in FIG. 2D, the current steering device 216, such as a typical MOS type transistor, is used to selectively deliver current through the memory element 112 by use of the appropriate set of word-lines, bit-lines and separate source-lines 119. As illustrated in FIG. 2D, each of the switching memory devices 200 contains a memory element 112 and current steering device 216 (e.g., transistor) that are connected to at least one of the electrodes 102, at least one of the electrodes 118 and at least one of the source lines 119. The source-lines 119 generally comprise one or more patterned conductive layers (e.g., metal) that are adapted provide a desired amount of current to the memory element 112 when the transistor in the current steering device is turned "on". The electrodes 102, electrodes 118 and source-lines 119 are typically biased by circuitry that is connected at the periphery of the memory chip on which the array of memory devices 200 are formed.

During operation, such as a read operation, the state of a memory element 112 in the switching memory device 200 can be sensed by applying a sensing voltage (i.e., a "read" voltage $V_{READ}$ (FIG. 2E)), such as applying about +0.5 volts (V), to an appropriate set of electrodes 102 and 118. Depending on its history, a memory element that is addressed in this way may be in either a high resistance state (HRS) or a low resistance state (LRS). The resistance of the memory element 112 therefore determines what digital data is being stored by the memory element 112. If the memory element 112 is in the high resistance state, for example, the memory element may be said to contain a logic "one" (i.e., a "1" bit). If, on the other hand, the memory element is in the low resistance state, the memory element may be said to contain a logic "zero" (i.e., a "0" bit). During a write operation, the state of a memory element can be changed by application of suitable write signals to an appropriate set of electrodes 102 and 118.

In some embodiments, the memory element 112 uses bipolar switching where opposite polarity set and reset voltages are used to alter the resistance of the memory element between high and low resistance states. FIG. 2E schematically illustrates a log-log plot of current (I) versus voltage (V) (e.g., reference numeral 251) of one example of a bipolar switching curve 252 of a resistive switching type of memory element, and thus illustrates typical threshold values used to set and reset the contents of a memory element 112. In one example, initially, memory element 112 may be in a high resistance state (e.g., storing a logic "zero"). The high resistance state of memory element 112 can be sensed by read and write circuitry 150 (FIG. 2A) using electrodes 102 and 118. For example, read and write circuitry may apply a read voltage $V_{READ}$ to memory element 112, and can sense the resulting "off" current ($I_{OFF}$) that flows through memory element 112. When it is desired to store a logic "one" in memory element 112, memory element 112 can be placed into its low-resistance state. This may be accomplished by using read and write circuitry 150 to apply a set voltage $V_{SET}$ (e.g., −2 V to −4 V) across electrodes 102 and 118. In one configuration, applying a negative $V_{SET}$ voltage to memory element 112 causes memory element 112 to switch to its low resistance state. It is believed that the change in the resistive state of memory element 112 may be due to the redistribution or filling of traps (i.e., "trap-mediated"), or defects, in the resistive switching layer, or variable resistance layer 206, when the device is reverse biased. The defects or traps, which are commonly formed during the deposition or initial burn-in or forming of the variable resistance layer 206, are often created by a non-stoichiometric material composition found in the formed variable resistance layer 206. $V_{SET}$ and $V_{RESET}$ are generally referred to as "switching voltages" herein.

The low resistance state of the memory element 112 can be sensed using the read and write circuitry 150. When a read voltage $V_{READ}$ is applied to resistive switching memory element 112, the read and write circuitry 150 will sense the relatively high "on" current value ($I_{ON}$), indicating that memory element 112 is in its low resistance state. When it is desired to store a logic "zero" in memory element 112, the memory element can once again be placed in its high resistance state by applying a positive reset voltage $V_{RESET}$ (e.g., +2 V to +5 V) to memory element 112. When read and write circuitry applies $V_{RESET}$ to memory element 112, memory element 112 enters its high resistance state. When the reset voltage $V_{RESET}$ is removed from memory element 112, memory element 112 will once again be characterized by high resistance when the read voltage $V_{READ}$ is applied. Voltage pulses can be used in the programming of the memory element 112. For example, a 1 microseconds (ms) to 1 nanoseconds (ns) square or trapezoidal shaped pulse can be used to switch the memory element 112. In some embodiments, it may be desirable to adjust the length of the pulse depending on the amount of time needed to switch the memory element 112. In one example, the "set" and "reset" pulses are each about 10 ns in length. While the discussion of the memory element 112 herein primarily provides bipolar switching examples, some embodiments of the memory element 112 may use unipolar switching, where the set and reset voltages have the same polarity, without deviating from the scope of the invention described herein.

To provide a measurable difference between the logic "zero" and logic "one" states is common to form the variable resistance layer 206 and other memory element 112 components so that the difference between the $I_{ON}$ and $I_{OFF}$ currents have a difference of at least one order of magnitude (e.g., current ratio $I_{ON}/I_{OFF}$~10). In other words, the ratio of the electrical resistances of the variable resistance layer 206 is decreased by at least 10 times when switching between the high and the low resistance states.

In an effort to prepare the memory element 112 for use, it is common to apply a forming voltage ($V_{FORM}$) at least once across the electrodes 102, 118 to "burn-in" the device. It is believed that the application of a forming voltage, which is typically significantly greater than the $V_{RESET}$ and $V_{SET}$ voltages, causes the defects that are formed within the variable resistance layer 206 during the device fabrication process to move, align and/or collect within various regions of the formed layer, causing the variable resistance layer 206 to consistently and reliably switch between the "on" and "off" resistive states throughout the memory element's life. In one configuration, the forming voltage is between about 1 and about 5 times greater than the $V_{RESET}$ or $V_{SET}$ voltage. In one example, the forming voltage is between about 1.4 and about 2.5 times greater than the $V_{RESET}$ or $V_{SET}$ voltage. In one example, the forming voltage is between about 3 and about 7 volts. However, it is noted that in some cases it is desirable to form the memory element 112 so that the application of a forming voltage is not required at all to assure that the device will perform as desired throughout its life.

Figure 3:
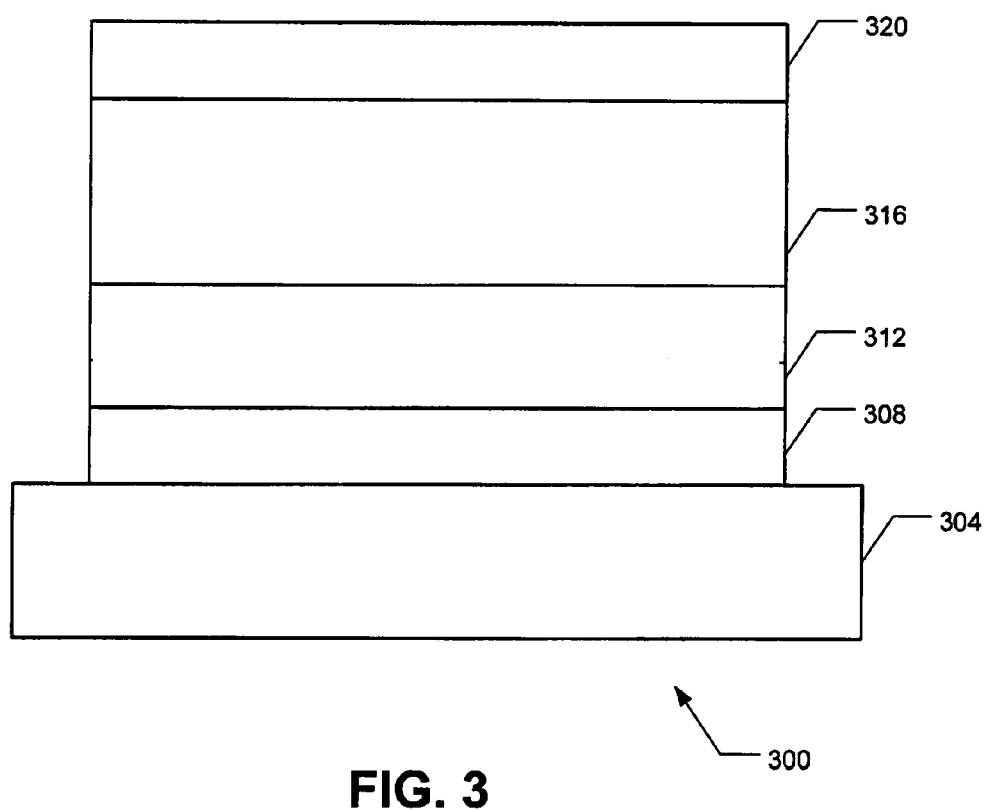
FIG. 3 is a schematic cross-sectional view of a resistive switching memory device formed in a single tool in accordance with some embodiments of the present disclosure.

FIG. 3 illustrates a simplified exemplary resistive memory element 300 formed using a single tool according to some embodiments of the present disclosure. The resistive memory element 300 generally includes a first electrode 308 on top of a surface or substrate 304, a resistive switching layer 312 on top of the first electrode, and a second electrode 320 on top of the resistive switching layer 312. Optionally, in some embodiments, a current limiting layer 316 is included between the resistive switching layer 312 and the second electrode 320. In some embodiments, the resistive switching layer 312 and current limiting layer 316 may be comprised of layers as described in detail in co-pending U.S. patent application Ser. No. 13/353,000 entitled "Nonvolatile Memory device Having a Current Limiting Element" filed on Jan. 18, 2012, which claims priority to U.S. Provisional Patent Application No. 61/513,355, entitled "Nonvolatile Memory device Having a Current Limiting Element" filed on Jul. 29, 2011, the entire disclosure of each which is incorporated by reference herein.

While each of the layers are shown as a single layer, it should be understood that any of these layers may be formed of multiple layers, or of one layer having variable composition or a composition gradient.

The first and second electrodes 308, 320 are generally formed of a conductive material having a desirable conductivity, and may be formed of the same, or different, materials. Examples of suitable materials include, but are not limited to: p or n-type polysilicon, transition metals, transition metal alloys, transition metal nitrides, and the like. In some embodiments, the electrode includes a metal and the metal is selected from any one or more of: titanium (Ti), tungsten (W), tantalum (Ta), hafnium (Hf), aluminum (Al), nickel (Ni), copper (Cu), palladium (Pd), platinum (Pt), cobalt (Co), molybdenum (Mo), ruthenium (Ru) and the like, and combinations thereof. In some embodiments, the first electrode is comprised of polysilicon, and the second electrode is comprised of titanium nitride (TiN).

The resistive switching layer 312 may be comprised of any suitable material, and is typically formed of a dielectric material such as a metal oxide or other similar material that can be switched between at least two or more stable resistive states. In some embodiments, the resistive switching layer 312 is comprised of any one or more of: hafnium oxide ($Hf_xO_y$), tantalum oxide ($Ta_xO_y$), aluminum oxide ($Al_xO_y$), lanthanum oxide ($La_xO_y$), yttrium oxide ($Y_xO_y$), dysprosium oxide ($Dy_xO_y$), ytterbium oxide ($Yb_xO_y$), zirconium oxide ($Zr_xO_y$), titanium oxide ($TiO_x$), nickel oxide ($NiO_x$), zinc oxide ($Zn_xO_y$), and the like, and combinations thereof. In some embodiments, multiple layers of different metal oxide materials may make up the resistive switching layer 312.

The current limiting layer 316 may be comprised of any suitable material, and is typically formed of a material that has a desirable work function which assists in good control of the electron flow between the current limiting layer 316 and the resistive switching layer 312. By forming a current limiting layer 316 that desirably modifies the work function of the first and second electrodes, the magnitude of the required $I_{on}$ and $I_{off}$ currents can be adjusted, as described in more detail in the co-pending Patent Application incorporated previously. In some embodiments, the current limiting layer 316 is comprised of one or more metal nitrides, such as any one or more of: hafnium nitride ($Hf_xN_y$), tantalum nitride ($Ta_xN_y$), titanium aluminum nitride ($Ti_xAl_yN_z$), titanium nitride ($Ti_xN_y$), and the like, and combinations thereof. In some embodiments, multiple layers of different metal nitride materials may make up the current limiting layer 316.

Figure 4:
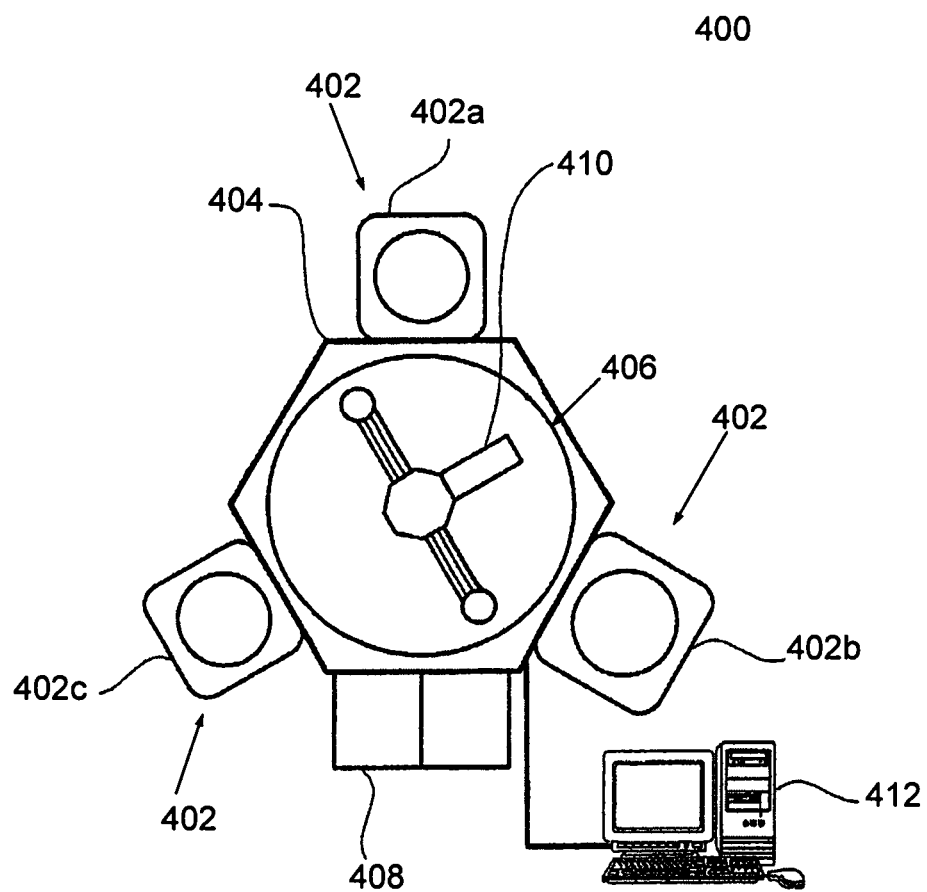
FIG. 4 is a simplified schematic diagram showing a single tool having multiple chambers configured to fabricate a resistive switching memory device in accordance with some embodiments of the present disclosure.

Of particular advantage, the switching layer(s) and current-limiting layer(s), and optionally one or more of the electrodes, are all formed in a single tool. FIG. 4 is a simplified schematic drawing illustrating one example of a single tool 400. In some embodiments tool 400 is broadly comprised of a frame 404 supporting one or more process chambers 402, a transfer chamber 406, and one or more load lock chambers 408. The transfer chamber 406 is generally disposed in the center of the tool 400 and is coupled to each of the process chambers 404 and the load lock chamber 408. In some embodiments, the environment within the tool 400 is controlled.

As shown in FIG. 4, the tool 400 is comprised of three process chambers 402a, 402b, 402c and one load lock chamber 408. While one specific example is shown, it will be understood that any number or configurations of chambers may be used, and that the invention is not limited to the specific examples shown herein. For example, in some embodiments, the tool 400 includes four process chambers. In some embodiments the tool 400 includes five or more process chambers.

Any suitable configuration or combination of process chambers may be used. For example in some embodiments where the tool 400 has three process chambers 402a, 402b, 402c, any number of the process chambers are atomic layer deposition (ALD) or chemical vapor deposition (CVD) chambers, and any number of the process chambers is a physical vapor deposition (PVD) chamber, and generally the arrangement of chambers will be dependent on the device requirements, among other factors.

The transfer chamber 406 typically includes a robot 410 configured to move the wafers between the various process chambers and to move the wafers into and out of the load lock chamber 308. Movement of wafers between the process and load lock chambers, and thus processing of the wafers, is controlled by a controller or microprocessor 412.

As described above, formation of the ReRAM device is accomplished in a single tool. The resistive switching layers (for example metal oxide materials) and the current limiting layers (for example metal nitride materials) that form the ReRAM device are all fabricated in the single tool 400. Optionally, one or more of the electrodes that form the ReRAM device may also be formed in the same tool 400. This is a significant departure from prior art techniques where oxide and nitride layers are formed in separate tools.

More specifically, the plurality of process chambers 402 may be of any type or configuration capable of depositing resistive switching layers and current limiting layers in the fabrication of a ReRAM device. In some embodiments, the resistive switching layers and current limiting layers will be deposited in independent chambers, that is some of the process chambers in the tool 400 are dedicated to deposition of the resistive switching layers and the other process chambers in the tool 400 are dedicated to deposition of the current limiting layers. Additionally, one or more of the electrodes, such as for example the second or top electrode may be deposited in one of the process chambers in the tool 400. In one example the second electrode is comprised of a metal nitride material and is formed in the same process chamber as that used to form the current limiting layers.

Alternatively in some embodiments, the resistive switching layers and current limiting layers may be deposited in a same process chamber in the tool 400. In this example, a similar deposition process is used to form both the resistive switching layers and current limiting layers. For example, when the resistive switching layers are comprised of metal oxides and the current limiting layers are comprised of metal nitrides, CVD, ALD or plasma enhanced ALD (PEALD) may be used to form both such layers in one ALD or CVD process chamber.

Figure 5:
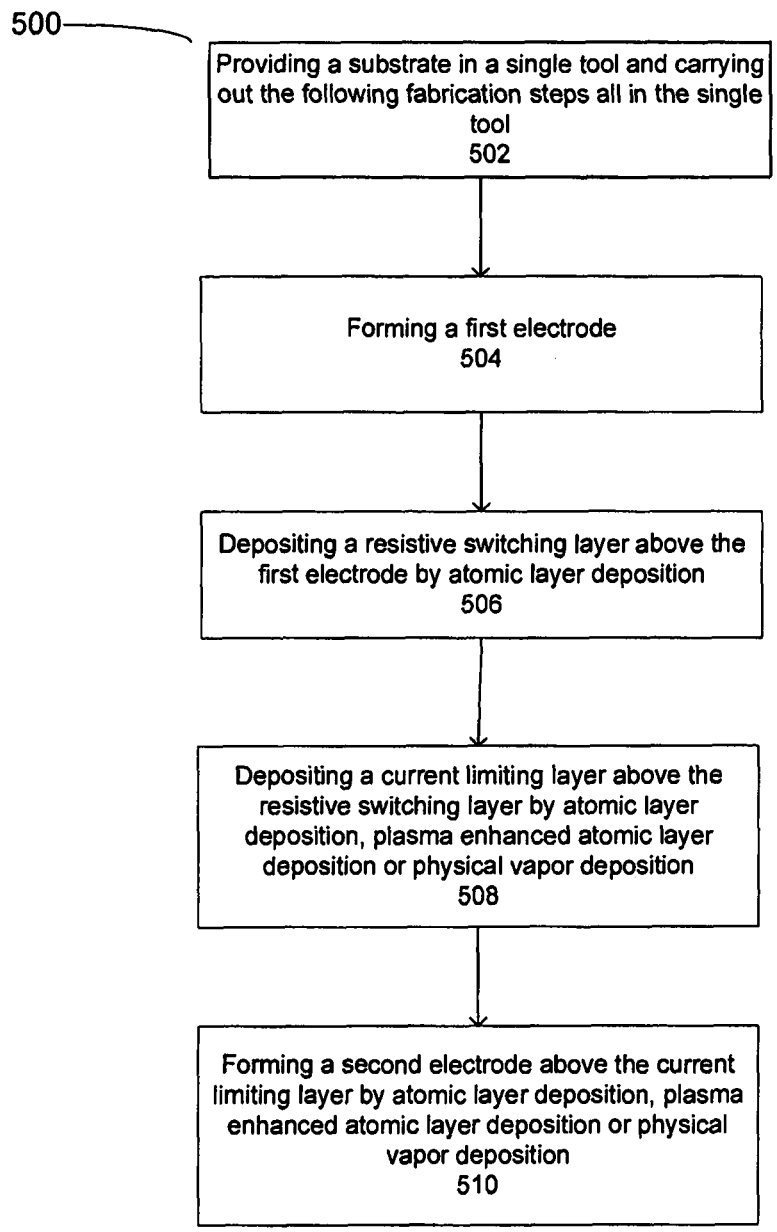
FIG. 5 is a flow diagram showing a method of making a resistive switching memory device in a single tool in accordance with some embodiments of the present disclosure.

FIG. 5 illustrates a method 500 of making a ReRAM device according to some embodiments of the present disclosure. In this example, the method 500 begins at step 502 by providing a substrate in a single tool and carrying out the following fabrication steps all in the same tool, where the tool comprises multiple processing chambers. Next, a first electrode is formed on the substrate at step 504. A resistive switching layer is deposited above the first electrode by atomic layer deposition at step 506. A current limiting layer is deposited above the resistive switching layer by atomic layer deposition, plasma enhanced atomic layer deposition or physical vapor deposition at step 508. A second electrode is then formed above the current limiting layer by atomic layer deposition, plasma enhanced atomic layer deposition or physical vapor deposition at step 510.

In some embodiments, systems and methods for preparing resistive switching memory devices, such as resistive random access memory (ReRAM) devices, are provided wherein both oxide and nitride layers are deposited in a single tool. In some embodiments, the oxide and nitride layers that form the ReRAM device as all deposited in a single ALD or CVD chamber. In some embodiments, the oxide and nitride layers that form the ReRAM device are all deposited in a single PVD chamber.

Figure 6:
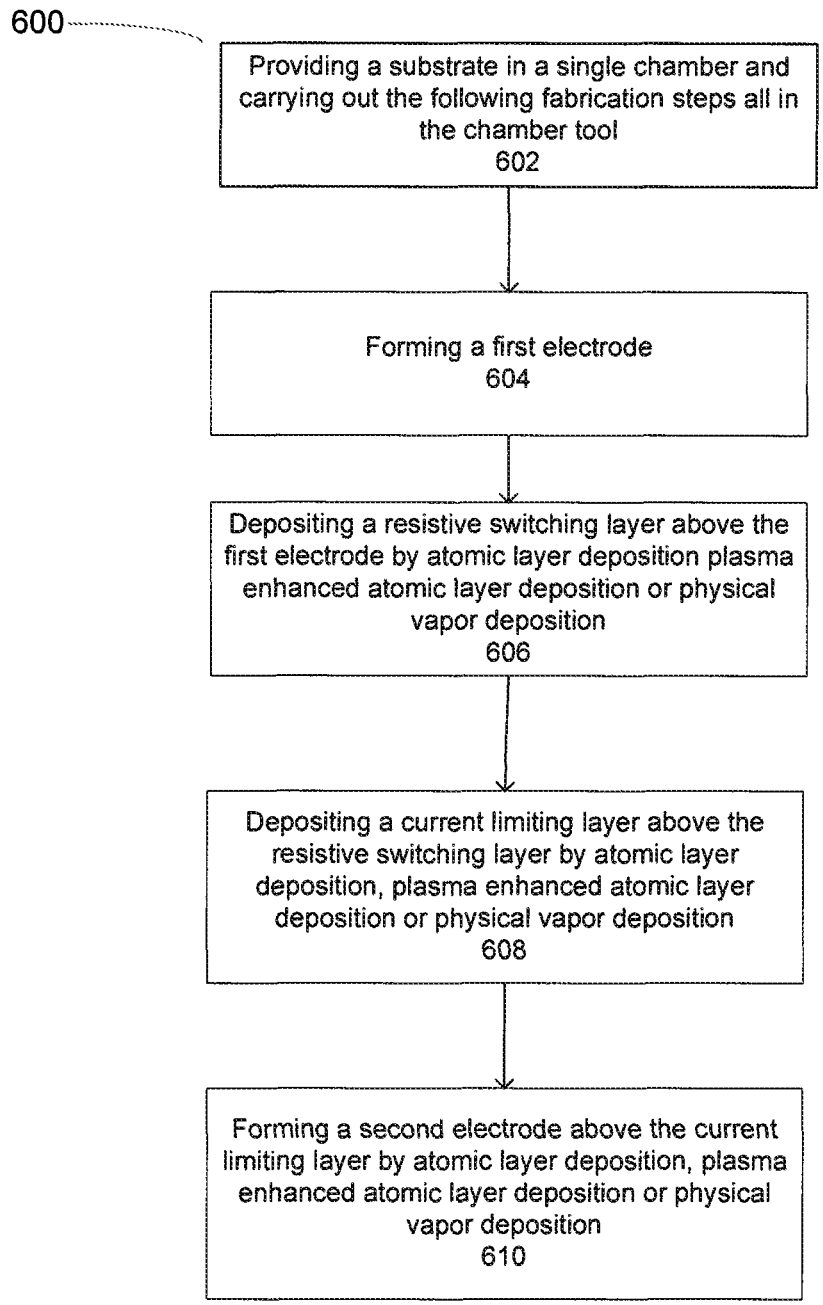
FIG. 6 is a flow diagram showing a method of making a resistive switching memory device in a single chamber in accordance with some embodiments of the present disclosure.

FIG. 6 illustrates a method 600 of making a ReRAM device according to some embodiments of the present disclosure. In this example, the method 600 begins at step 602 by providing a substrate in a single chamber and carrying out the following fabrication steps all in the same chamber: a first electrode is formed on the substrate at step 604. A resistive switching layer is deposited above the first electrode at step 606. A current limiting layer is deposited above the resistive switching layer at step 608. A second electrode is then formed above the current limiting at step 610.

In some embodiments, the single chamber is comprised of an ALD or CVD chamber and all of the steps are carried out by atomic layer deposition or chemical vapor deposition. In this embodiment, chemical precursors having the same or similar ligands are used to form the oxide and nitride layers and the electrodes.

In some embodiments, the single chamber is comprised of a PVD chamber and all of the steps are carried out by physical vapor deposition.

EXAMPLES

A number of examples will be proposed according to some embodiments of the present disclosure. The examples are shown here for illustration purposes only and are not intended to limit the scope of the invention in any way.

Example 1

Single Chamber

Place a substrate into chamber 1 and deposit switching layer (312) on the wafer according to the following ALD deposition conditions: Substrate temperature fixed between 200-350 C, chamber pressure between 0.5-2.0 Torr, repeat ALD cycles to form a layer of desired thickness: using approximately 100-500 sccm Ar carrier gas to deliver the metal precursor (i.e. one of TDMAHf, TEMAHf, HfCl$_4$, TDMATi, TEMATi, TiCl$_4$, TMA, TEMAZr, ZyALD™, PDMATa) between 0.5-30 sec, purge ~200-5000 sccm Ar between 5-60 sec, pulse oxidant (i.e. one of H$_2$O, O$_3$, plasma O$_2$) between 0.5-30 sec, purge approximately ~200-5000 sccm Ar between 5-60 sec.

The substrate stays in chamber 1, and the process can continue after purge steps to deposit the current limiting layer (316) according to the following ALD deposition conditions: Substrate temperature fixed between 200-350 C, chamber pressure between 0.5-2.0 Torr, repeat ALD cycles to form a layer of desired thickness: use ~100-500 sccm Ar carrier gas to deliver the metal precursor (i.e. one of TDMAHf, TEMAHf, HfCl$_4$, TDMATi, TEMATi, TiCl4, PDMATa) between 0.5-30 sec, purge ~200-5000 sccm Ar between 5-60 sec, pulse reducing agent (i.e. one of NH$_3$, H$_2$) between 0.5-30 sec, purge ~200-5000 sccm Ar between 5-60 sec.

The substrate stays in chamber 1, and then the process can continue after purge steps to deposit the top electrode (320) according to the following ALD deposition conditions: Substrate temperature fixed between 200-350 C, chamber pressure between 0.5-2.0 Torr, repeat ALD cycles to form a layer of desired thickness: using approximately 100-500 sccm Ar carrier gas to deliver the metal precursor (i.e. one of TDMATi, TEMATi, TiCl$_4$, TMA) between 0.5-30 sec, purge approximately 200-5000 sccm Ar between 5-60 sec, pulse reducing agent (i.e. one of NH$_3$, H$_2$) between 0.5-30 sec, purge approximately 200-5000 sccm Ar between 5-60 sec.

Example 2

Single Tool with Multiple Chambers

Place substrate into chamber 1 and deposit switching layer (312) on the substrate according to the following ALD deposition conditions: Substrate temperature fixed between 200-350 C, chamber pressure between 0.5-2.0 Torr, repeat ALD cycles to form a layer of desired thickness: using approximately 100-500 sccm Ar carrier gas to deliver the metal precursor (i.e. one of TDMAHf, TEMAHf, HfCl4, TDMATi, TEMATi, TiCl$_4$, TMA, TEMAZr, ZyALD™, PDMATa) between 0.5-30 sec, purge approximately 200-5000 sccm Ar between 5-60 sec, pulse oxidant (i.e. one of H$_2$O, O$_3$, plasma O$_2$) between 0.5-30 sec, purge approximately 200-5000 sccm Ar between 5-60 sec.

The substrate stays in chamber 1 (or may be transferred to another chamber), and the process can continue after purge steps to deposit the current limiting layer (312) according to the following ALD deposition conditions: Substrate temperature fixed between 200-350 C, chamber pressure between 0.5-2.0 Torr, repeat ALD cycles to form a layer of desired thickness: using approximately 100-500 sccm Ar carrier gas to deliver the metal precursor (i.e. one of TDMAHf, TEMAHf, HfCl4, TDMATi, TEMATi, TiCl4, PDMATa) between 0.5-30 sec, purge approximately-200-5000 sccm Ar between 5-60 sec, pulse reducing agent (i.e. one of NH$_3$, H$_2$) between 0.5-30 sec, purge approximately 200-5000 sccm Ar between 5-60 sec.

Next, the robot accesses substrate in chamber 1 and transfers substrate to chamber 2. In chamber 2, top electrode layer (320) is deposited on the substrate according to following PVD conditions: Substrate temperature fixed between room temperature and 600 C, chamber pressure lower than 10 mTorr, the sputtering gas ratio (argon/nitrogen, argon/oxygen) ranged from 0 to 100% with sputtering power fixed between 25 and 500 W. The deposition time varies depending on the deposition rate and the desired film thickness. While specific experimental examples have been described, many other combinations of the three layers may be formed. For example, in some embodiments, the following arrangements are provided: Switching layer PVD, current limiting layer ALD, top electrode PVD 2. Switching layer PVD, current limiting layer PVD, top electrode PVD
3. Switching layer ALD, current limiting layer PVD, top electrode ALD.

The invention has been described in relation to particular examples, which are intended in all respects to be illustrative rather than restrictive. Various aspects and/or components of the described embodiments may be used singly or in any combination. It is intended that the specification and examples be considered as exemplary only, with a true scope and spirit of the invention being indicated by the claims.

What is claimed is:

1. A method of making a resistive switching memory device on a substrate, the method comprising:
    fabricating the resistive switching memory device in a single chamber, wherein the fabricating comprises:
    forming a first layer above the substrate, the first layer operable as a first electrode of the resistive switching memory device;
    forming a second layer above the first layer, the second layer operable as a resistive switching layer of the resistive switching memory device;
    forming a third layer above the second layer, the third layer operable as a current limiting layer of the resistive switching memory device; and
    forming a fourth layer above the third layer, the fourth layer operable as a second electrode of the resistive switching memory device,
    wherein the first layer and the fourth layer are formed from different materials; and
    wherein the second layer, the third layer, and the fourth layer are formed under a same range of substrate temperature range process conditions, chamber pressure range process conditions, and carrier gas purge range process conditions.

2. The method of claim 1, wherein the first layer, the second layer, the third layer, and the fourth layer are deposited by atomic layer deposition.

3. The method of claim 1, wherein the second layer comprises one or more metal oxides.

4. The method of claim 3, wherein the one or more metal oxides comprise one or more of hafnium oxide (HfxOy), tantalum oxide (TaxOy), aluminum oxide (AlxOy), lanthanum oxide (LaxOy), yttrium oxide (YxOy), dysprosium oxide (DyxOy), ytterbium oxide (YbxOy), zirconium oxide (ZrxOy), titanium oxide (TiOx), nickel oxide (NiOx), zinc oxide (ZnxOy), or combinations thereof 5. The method of claim 1, wherein the third layer comprises one or more metal nitrides.

6. The method of claim 5, wherein the one or more metal nitrides comprises hafnium nitride (HfxNy), tantalum nitride (TaxNy), titanium aluminum nitride (TixAlyNz), titanium nitride (TixNy), or combinations thereof.

7. The method of claim 1, wherein the first layer comprises polysilicon.

8. The method of claim 1, wherein the fourth layer comprises titanium nitride.

9. The method of claim 1, wherein the second layer comprises one of hafnium oxide (HfxOy), tantalum oxide (TaxOy), aluminum oxide (AlxOy), lanthanum oxide (LaxOy), yttrium oxide (YxOy), dysprosium oxide (DyxOy), ytterbium oxide (YbxOy), zirconium oxide (ZrxOy), titanium oxide (TiOx), nickel oxide (NiOx), zinc oxide (ZnxOy), or a combination thereof.

10. The method of claim 1, wherein the third layer comprises one of hafnium nitride (HfxNy), tantalum nitride (TaxNy), titanium aluminum nitride (TixAlyNz), titanium nitride (TixNy), or a combination thereof.

11. The method of claim 1, wherein the second layer comprises a metal oxide and wherein the third layer comprises a metal nitride.

12. The method of claim 11, wherein the forming of the second layer comprises supplying a first chemical precursor, wherein the forming of the third layer comprises supplying a second chemical precursor, and wherein the first chemical precursor and the second chemical precursor comprise a same ligand.

13. The method of claim 1, wherein the forming of the second layer comprises supplying one of TDMAHf, TEMAHf, HfCl4, TDMATi, TEMATi, TiCl4, TMA, TEMAZr, or PDMATa into the single chamber while the substrate is maintained at a temperature of between 200° C. and 350° C. followed by supplying one of H2O, O3, or plasma O2 into the single chamber.

14. The method of claim 13, wherein the forming of the third layer comprises supplying TDMAHf, TEMAHf, HfCl4, TDMATi, TEMATi, TiCl4, or PDMATa into the single chamber followed by supplying one of NH3 or H2 into the single chamber.

15. The method of claim 14, wherein the forming of the fourth layer comprises supplying TDMAHf, TEMAHf, HfCl4, TDMATi, TEMATi, TiCl4, or PDMATa followed by supplying one of NH3 or H2 into the single chamber.

16. The method of claim 1, wherein the second layer comprises hafnium oxide and wherein the third layer comprises titanium aluminum nitride.

17. The method of claim 1, wherein the resistive switching layer is configured to change a resistance between a low resistance state and a high resistance state.

18. The method of claim 1, wherein the second layer and the third layer are formed in a same processing chamber.

* * * * *